United States Patent
Eda et al.

(10) Patent No.: US 9,012,246 B2
(45) Date of Patent: Apr. 21, 2015

(54) MANUFACTURING METHOD OF SEMICONDUCTOR DEVICE AND POLISHING APPARATUS

(71) Applicant: Kabushiki Kaisha Toshiba, Tokyo (JP)

(72) Inventors: Hajime Eda, Kanagawa-ken (JP); Gaku Minamihaba, Kanagawa-ken (JP); Yukiteru Matsui, Aichi-ken (JP); Akifumi Gawase, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 13/779,093

(22) Filed: Feb. 27, 2013

(65) Prior Publication Data
US 2014/0004628 A1    Jan. 2, 2014

(30) Foreign Application Priority Data
Jul. 2, 2012 (JP) ................................. 2012-148899

(51) Int. Cl.
| | |
|---|---|
| *H01L 21/66* | (2006.01) |
| *B24B 49/02* | (2006.01) |
| *B24B 37/013* | (2012.01) |
| *B24B 49/10* | (2006.01) |
| *H01L 21/768* | (2006.01) |
| *H01L 21/321* | (2006.01) |

(52) U.S. Cl.
CPC ................ *H01L 22/14* (2013.01); *B24B 49/02* (2013.01); *B24B 37/013* (2013.01); *B24B 49/105* (2013.01); *H01L 22/26* (2013.01); *H01L 21/7684* (2013.01); *H01L 21/3212* (2013.01)

(58) Field of Classification Search
CPC ......... H01L 22/14; H01L 22/66; H01L 22/26; B24B 37/013; B24B 49/105
USPC ............................................ 438/17; 451/1, 11
See application file for complete search history.

(56) References Cited

U.S. PATENT DOCUMENTS

| | | | | |
|---|---|---|---|---|
| 6,224,464 | B1* | 5/2001 | Nojo et al. ....................... | 451/41 |
| 7,465,668 | B2* | 12/2008 | Fukushima et al. ........... | 438/692 |
| 8,334,210 | B2* | 12/2012 | Shiratani et al. ............... | 438/692 |
| 8,575,030 | B2* | 11/2013 | Minamihaba et al. ......... | 438/692 |
| 2002/0002029 | A1* | 1/2002 | Kimura et al. .................. | 451/41 |
| 2003/0057457 | A1* | 3/2003 | Yamada et al. ................ | 257/249 |
| 2004/0070077 | A1* | 4/2004 | Minamihaba et al. ......... | 257/758 |
| 2004/0203192 | A1* | 10/2004 | Gracias .......................... | 438/118 |
| 2007/0049166 | A1* | 3/2007 | Yamaguchi et al. .............. | 451/5 |
| 2007/0082456 | A1* | 4/2007 | Uotani et al. .................. | 438/427 |

(Continued)

FOREIGN PATENT DOCUMENTS

| | | |
|---|---|---|
| JP | 2003-68681 | 3/2003 |
| JP | 2004-249452 | 9/2004 |
| JP | 2008-235609 | 10/2008 |

(Continued)

*Primary Examiner* — Savitr Mulpuri
(74) *Attorney, Agent, or Firm* — Finnegan, Henderson, Farabow, Garrett & Dunner, L.L.P.

(57) ABSTRACT

According to an embodiment, a method of manufacturing a semiconductor device includes forming a wiring groove on an insulating film; forming a barrier metal layer and a metal layer; polishing the metal layer by applying a first load on the metal layer; and subsequently polishing the metal layer while applying a second load larger than the first load on the metal layer and spraying a gas onto a polishing pad. The polishing pad is in contact with the metal layer. The barrier metal layer covers an upper surface of the insulating film and an inner surface of the wiring groove, and the metal layer fills an inside of the wiring groove and covers the barrier metal layer.

12 Claims, 6 Drawing Sheets

(56) References Cited

U.S. PATENT DOCUMENTS

| | | | |
|---|---|---|---|
| 2007/0148953 A1* | 6/2007 | Itani et al. | 438/618 |
| 2007/0218680 A1* | 9/2007 | Itani et al. | 438/638 |
| 2008/0076253 A1* | 3/2008 | Fukada | 438/692 |
| 2009/0068840 A1* | 3/2009 | Minamihaba et al. | 438/693 |
| 2009/0258493 A1 | 10/2009 | Matsui et al. | |
| 2013/0040456 A1* | 2/2013 | Eda et al. | 438/653 |

FOREIGN PATENT DOCUMENTS

| | | |
|---|---|---|
| JP | 2008-307630 | 12/2008 |
| JP | 2009-39548 | 2/2009 |
| JP | 2009-206240 | 9/2009 |

* cited by examiner

US 9,012,246 B2

MANUFACTURING METHOD OF SEMICONDUCTOR DEVICE AND POLISHING APPARATUS

CROSS-REFERENCE TO RELATED APPLICATIONS

This application is based upon and claims the benefit of priority from Japanese Patent Application No. 2012-148899, filed on Jul. 2, 2012; the entire contents of which are incorporated herein by reference.

FIELD

Embodiments are generally related to a manufacturing method of a semiconductor device and a polishing apparatus.

BACKGROUND

A chemical mechanical polishing (CMP) for flattening a wafer surface is used in a manufacturing processes of a semiconductor device, such as multilayer wiring, device isolation and the like. For example, a silicon oxide film and metal films of tungsten (W), copper (Cu), aluminum (Al) and the like formed on the wafer are polished to form wirings and contact plugs. Further, improvement in flatness, reduction of surface defects, and improvements in productivity are required, accompanying refinement of the semiconductor device. Especially, reduction of the surface defects is strongly required, since the surface defects such as corrosions, residual metal and the like strongly affect manufacture yield.

BRIEF DESCRIPTION OF THE DRAWINGS

FIGS. 3A to 3C are schematic cross sectional views showing a polishing process according to the.

DETAILED DESCRIPTION

According to an embodiment, a method of manufacturing a semiconductor device includes forming a wiring groove on an insulating film; forming a barrier metal layer and a metal layer; polishing the metal layer by applying a first load on the metal layer; and subsequently polishing the metal layer while applying a second load larger than the first load on the metal layer and spraying a gas onto a polishing pad. The polishing pad is in contact with the metal layer. The barrier metal layer covers an upper surface of the insulating film and an inner surface of the wiring groove, and the metal layer fills an inside of the wiring groove and covers the barrier metal layer.

Hereinbelow, embodiments of the invention will be described with reference to the drawings. Note that, as for parts identical among the drawings, same reference numbers are given and detailed descriptions thereof will suitably be omitted; and descriptions will be given on differing parts.

The embodiments relate to a method of manufacturing a semiconductor device, and relate to a method of polishing a metal wiring layer in a wiring process for example of a memory, a system LSI (Large Scale Integrated circuit), a high-speed logic LSI, a memory-logic consolidated LSI and the like.

Figure 1:
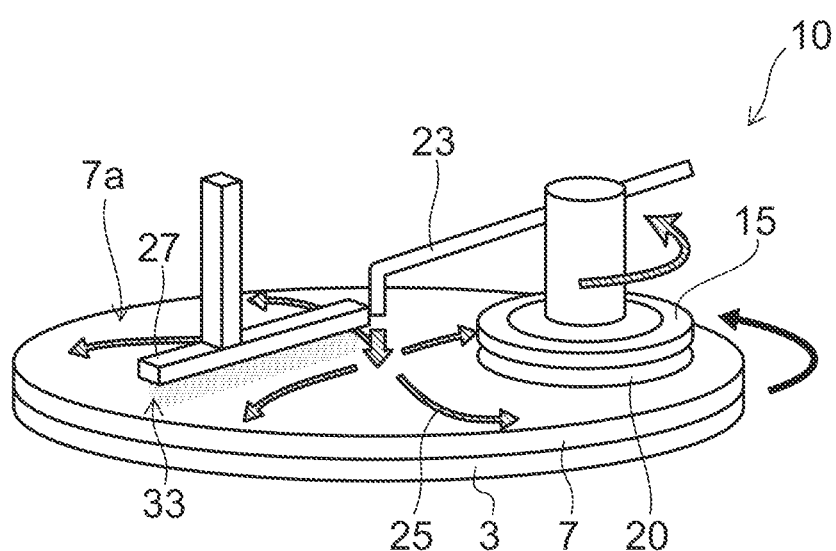
FIG. 1 is a perspective view schematically showing a polishing apparatus according to an embodiment.

FIG. 1 is a perspective view schematically showing a polishing apparatus 10 according to an embodiment. The polishing apparatus 10 includes a polishing stage 3, a wafer holder 15, a slurry nozzle 23, and a gas nozzle 27. A polishing pad 7 is attached to an upper surface of the polishing stage 3. On the other hand, a wafer 20 is fixed to a surface of the wafer holder 15 facing the polishing pad 7. Further, a metal layer formed on a surface of the wafer 20 is polished by causing the polishing stage 3 to rotate parallel to a polishing surface 7a and causing the wafer holder 15 to contact a surface of the polishing pad 7.

In the polishing apparatus 10, both the polishing stage 3 and the wafer holder 15 may rotate to polish the surface of the wafer 20 being in contact with the polishing pad 7. Slurry 25 is supplied onto the surface of the polishing pad 7 via the slurry nozzle 23.

Further, the polishing apparatus 10 includes the gas nozzle 27, and the metal layer is polished while spraying a gas 33 onto the polishing surface 7a of the polishing pad 7. The gas 33 for example is compressed air, nitride and the like.

Temperature of the polishing surface 7a rises for example due to friction heat or reaction heat generated between the wafer 20 and the polishing surface 7a. Accordingly, a chemical reaction at a surface of the metal layer progresses and it becomes easier for corrosions to occur. As a result, in the embodiment, the temperature is reduced by spraying the gas 33 onto the polishing pad 7, and the occurrence of the corrosions is thereby suppressed.

Next, a method of manufacturing a semiconductor device according to the embodiment will be described with reference to FIGS. 2A to 2D. FIG. 2A to FIG. 2D are schematic cross sectional views showing a process of forming wirings on the surface of the wafer 20.

Figure 2A:
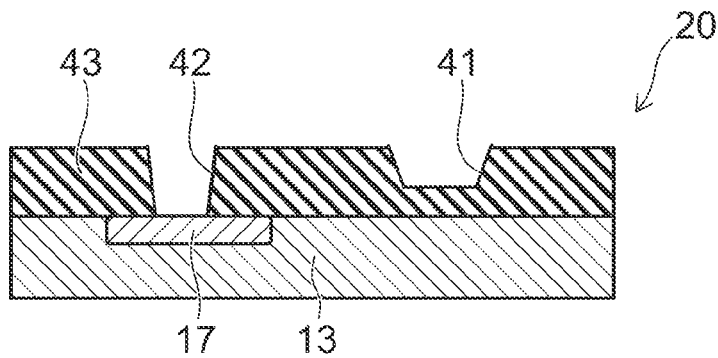
FIGS. 2A to 2D are schematic cross sectional views showing a manufacturing process according to the embodiment.

As shown in FIG. 2A, an insulating layer 43 is formed on a silicon substrate 13 on which a transistor and the like that is not shown is formed, for example. The insulating layer 43 is for example a silicon oxide film. A wiring groove 41 is formed on the insulating layer 43. The wiring groove 41 includes a contact hole 42 that communicates with a contact region 17 formed in the silicon substrate 13.

Figure 2B:
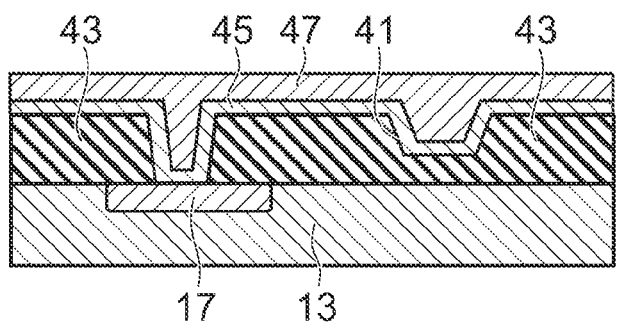

Next, as shown in FIG. 2B, a barrier metal (BM) layer 45, which is a first metal layer, is formed so as to cover an upper surface of the insulating layer 43 and an inner surface of the wiring groove 41. The BM layer 45 is for example a laminate layer of titanium (Ti) and tantalum (Ta). The BM layer 45 contacts the contact region 17 at a bottom of the contact hole 42.

Subsequently, a second metal layer (hereinbelow "metal layer 47") is formed on the BM layer 45. The metal layer 47 is for example an electroplated layer of copper (Cu), filling inside of the wiring groove 41, and covers a surface of the BM layer 45.

Figure 2C:
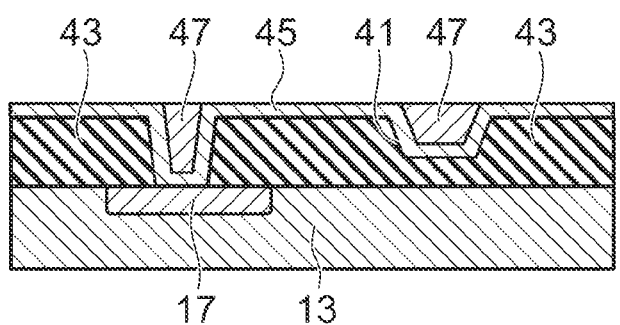

Next, as shown in FIG. 2C, a primary polishing is performed to remove the metal layer 47 formed on the BM layer 45, using the CMP method and leaving the metal layer 47 inside the wiring groove 41. The primary polishing is performed in two processes of a first polishing process of applying a first load to the wafer holder 15 and polishing under a state in which the wafer 20 is pressed against the polishing pad 7 by the load, and a second polishing process of removing the metal layer 47 remaining on the BM layer 45.

In the first polishing process, the metal layer 47 is left inside the wiring groove 41, and most part of the metal layer 47 formed on the BM layer 45 is removed. Subsequently, in the second polishing process, the metal layer 47 on the BM layer 45 is polished and removed, which remains for example due to a protrusion and recess pattern of the upper surface of the insulating layer 43. In the second polishing process, the polishing is performed while applying a second load that is heavier than the first load to the wafer 20, and further spraying a gas onto the surface of the polishing pad.

Figure 2D:
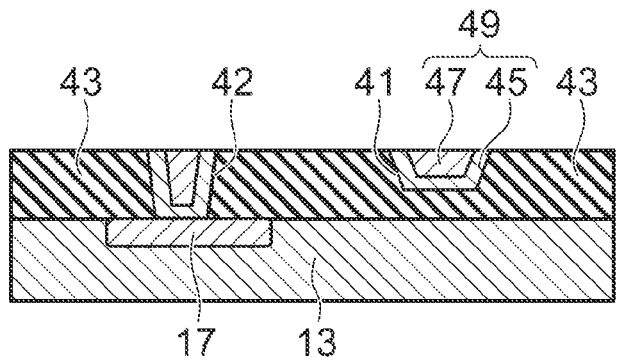

Next, as shown in FIG. 2D, a touch-up polishing is performed using the CMP method in order to remove the BM layer 45 formed on the upper surface of the insulating layer 43. Thereby, the metal layer 47 and the BM layer 45 on the insulating layer 43 are removed, and a wiring 49 including the metal layer 47 and the BM layer 45 is formed inside the wiring groove 41.

Figure 3A:
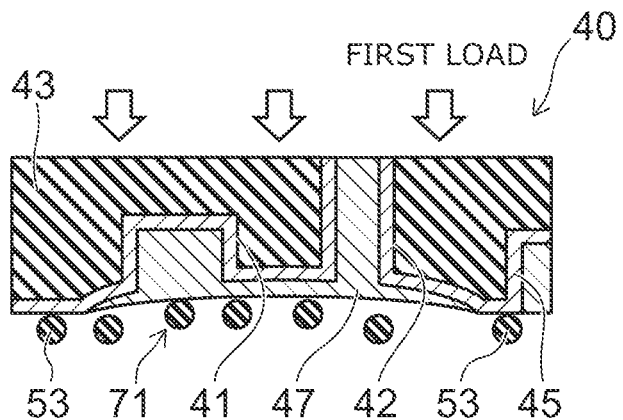
Figure 3B:
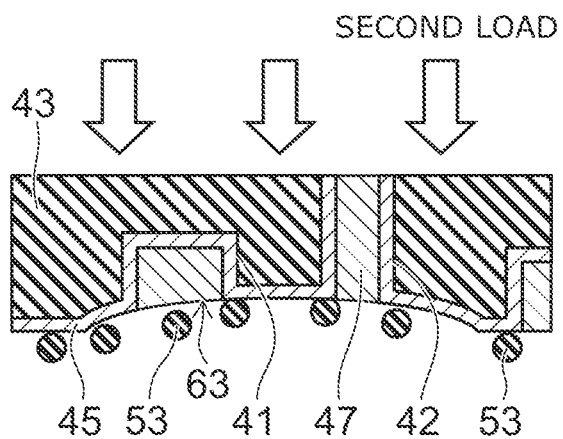
Figure 3C:
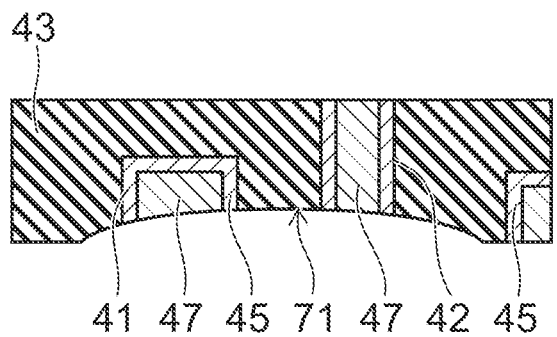

Next, a polishing process according to the embodiment will be described with reference to FIGS. 3A to 3C. FIG. 3A to FIG. 3C are partial cross sectional views schematically showing a wiring layer 40 formed on the surface of the wafer 20. Note that, top and bottom of FIGS. 2A to 2D are inverted herein to indicate the polishing process.

FIG. 3A shows the finished state of the first polishing process in the primary polishing. The wiring layer 40 includes a recess portion 71 formed therein. For example, if the metal layer 47 is to be polished flatly, part of the metal layer 47 is left inside the recess portion 71. As a result, polishing of the BM layer 45 in the touch-up polishing successive to the primary polishing is hindered, and there is a risk that the wiring groove 41 and the wiring 49 provided in the contact hole 42 that are adjacent to one another may be short-circuited. To avoid such a risk, the touch-up polishing may become necessary to take a long time.

Thus, the second polishing process is performed subsequent to the first polishing process to polish and remove the metal layer 47 left in the recess portion 71. In the second polishing process, the polishing is performed with the heavier load than in the first polishing process. As shown in FIG. 3B, polishing that follows a shape of the recess portion 71 of the wiring layer 40 becomes possible, and the metal layer 47 can be removed from the recess portion 71.

Further, in the second polishing process, the polishing is performed while spraying the gas onto the surface of the polishing pad. For example, as shown in FIG. 1, the compressed air or nitrogen gas is sprayed from the gas nozzle 27 toward the polishing pad 7. For example, the gas nozzle 27 includes a bar-shaped nozzle that extends in a direction from a center of the polishing pad 7 toward an outer circumference of the same, and a plurality of gas outlets is formed aligning on a surface facing the polishing pad 7. By this configuration, the gas can be sprayed onto the entire surface of the rotating polishing pad 7. A plurality of gas nozzles 27 may be disposed, and the shape thereof is not limited to the bar-shape; it may be of a shape with a larger area facing the polishing pad 7 to spray the gas onto an even larger range of the surface.

By this configuration, the occurrence of the corrosions can be suppressed on the surface of the metal layer 47 embedded in the wiring groove 41 and the contact hole 42.

Subsequently, the touch-up polishing is performed, and the BM layer 45 is removed from the upper surface of the insulating layer 43 as shown in FIG. 3C. As a result, wirings 49 that are insulated from one another can be formed inside the wiring groove 41 and the contact hole 42, respectively.

Thus, in the second polishing process of the primary polishing, followability of a polished amount to a foundation (hereafter "foundation followability") is improved by increasing load, and residue of the metal layer 47 remaining at the recess portion 71 can be reduced. As a result, the wirings can be prevented from short-circuiting, and manufacturing yield can be improved. Further, polishing time can be shortened for the BM layer 45 during the touch-up polishing.

Figure 4:
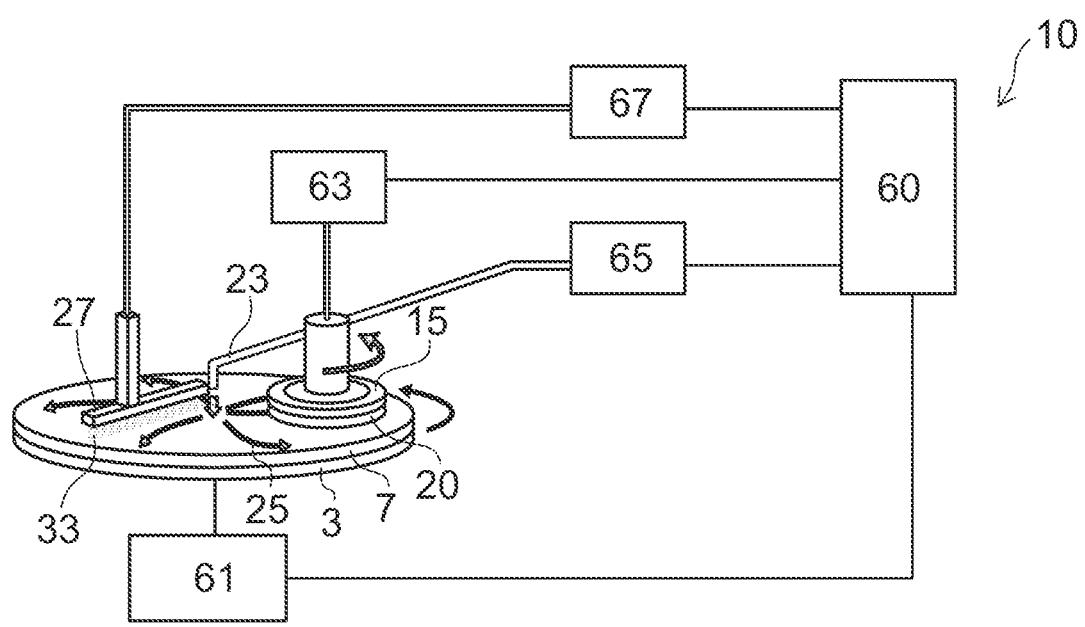
FIG. 4 is a block diagram showing the polishing apparatus according to the embodiment
Figure 5:
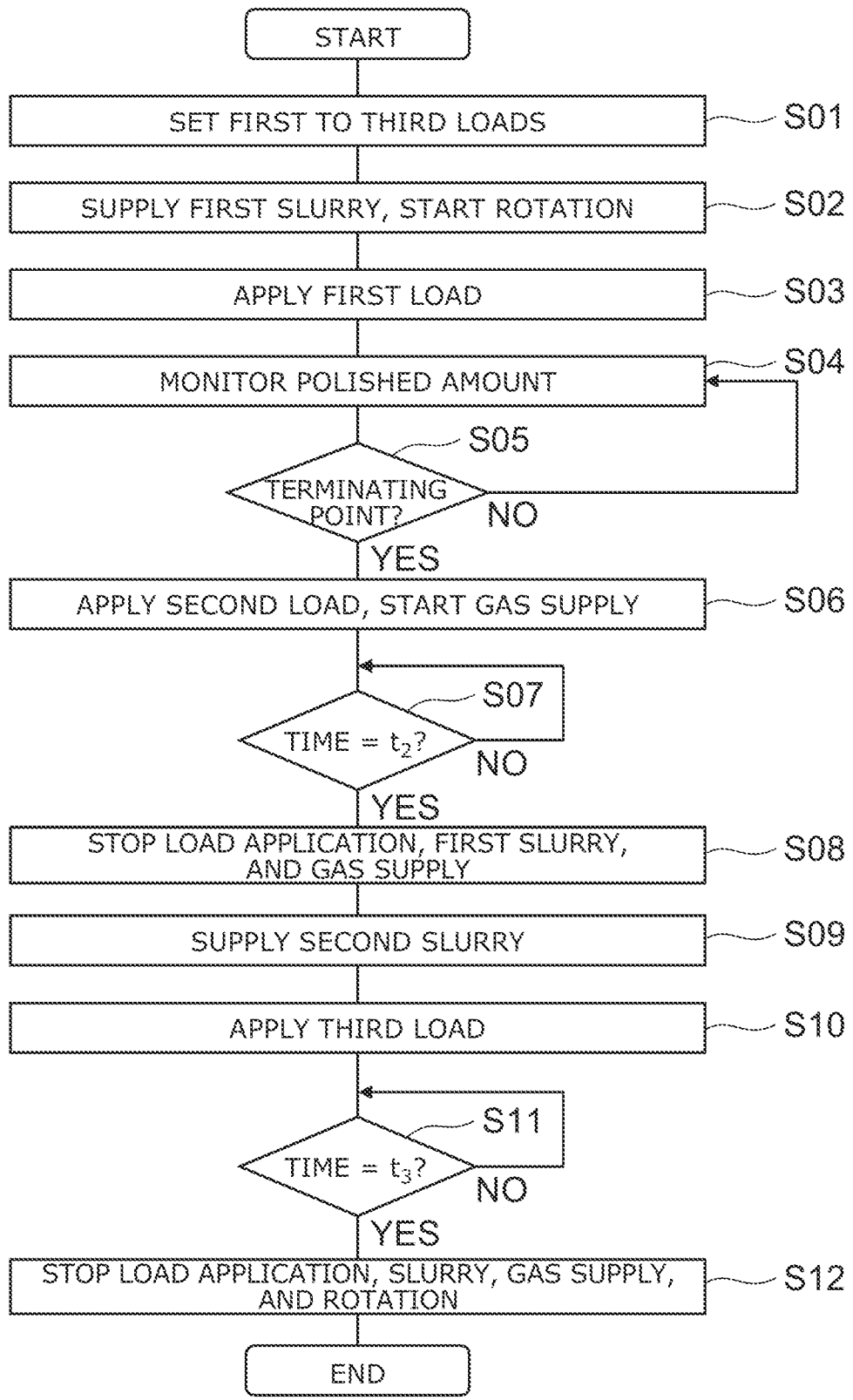
FIG. 5 is a flow chart showing the polishing process according to the embodiment.

Next, a polishing method according to the embodiment will be described in detail with reference to FIG. 4 and FIG. 5. FIG. 4 is a block diagram showing a control system of the polishing apparatus 10. FIG. 5 is a flow chart showing the polishing process according to the embodiment.

As shown in FIG. 4, the polishing apparatus 10 includes a driving section 61 that rotates the polishing stage 3, a holder controlling section 63 that controls the wafer holder 15, a slurry supplying section 65 that supplies slurry via the slurry nozzle 23, and a gas supplying section 67 that controls gas spraying. Further, the polishing apparatus 10 includes a controller 60 that controls the respective sections and performs polishing.

For example, the wafer 20 is set on the wafer holder 15, and the surface of the wafer 20 is caused to contact the polishing pad 7. Subsequently, a first load, a second load, and a third load are set (S01). Specifically, the first to third loads are inputted to the controller 60. Respective values thereof may be stored in the controller 60 in advance. The first load and the second load are loads in the primary polishing, and the third load is a load in the touch-up polishing. The second load is larger than the first load, however, the third load is suitably set irrelevant to the first load and the second load.

Next, the controller 60 controls the slurry supplying section 65, and supplies first slurry 25 suitable for the polishing of the metal layer 47. Further, the driving section 61 rotates the polishing stage 3 at a predetermined number of revolutions, for example, 10 to 100 rpm (S02). Simultaneously, the holder controlling section 63 may be controlled to cause the wafer holder 15 to rotate.

Subsequently, the holder controlling section 63 is controlled to perform a first polishing process in the primary polishing. In the first polishing process, the metal layer 47 is polished while applying the first load to the wafer holder 15 (S03). Further, in the first polishing process, the metal layer 47 is polished while a polished amount thereof is being monitored (S04). The polished amount can for example be detected by monitoring an eddy current that flows in the metal layer 47. Further, a terminating point at which the polished amount of the metal layer 47 reaches a predetermined condition is detected, and the process transitions to a second polishing process (S05).

In the second polishing process, the holder controlling section 63 increases the polishing load from the first load to the second load. Then, the gas supplying section 67 sprays a gas onto the polishing pad 7 via the gas nozzle 27, and a surface of the polishing pad 7 is thereby cooled (S06).

As a result, the metal layer 47 remaining at the recess portion of the insulating layer 32 can be removed. Further, by cooling the polishing pad 7, corrosions generated at the surface of the metal layer 47 can be reduced.

In the second polishing process, polishing time may determine a terminating point (S07). That is, after having transitioned from the first polishing process to the second polishing process, when a predeterminedly set period of time $t_2$ is elapsed, the polishing load application is stopped, and the supplies of the first slurry and the gas are stopped (S08).

Next, second slurry suitable for polishing the BM layer 45 is supplied (S09), and the third load is applied to start the touch-up polishing (S10). The touch-up polishing may be consecutively performed after the second polishing process. It may also be possible to discontinuously perform the touch-up polishing after the second polishing process. That is, it may be possible to make an interruption between the second polishing process and the touch-up polishing. For instance, the polishing pad used in the first and second polishing processes may be changed during the interruption with another one, which is going to use in the touch-up polishing.

Subsequently, when a predeterminedly set period of time $t_3$ is elapsed (S11), the load application is stopped, the supply of the second slurry is stopped, the rotation of the polishing stage 3 is stopped, and the polishing process is completed (S12).

Figure 6:
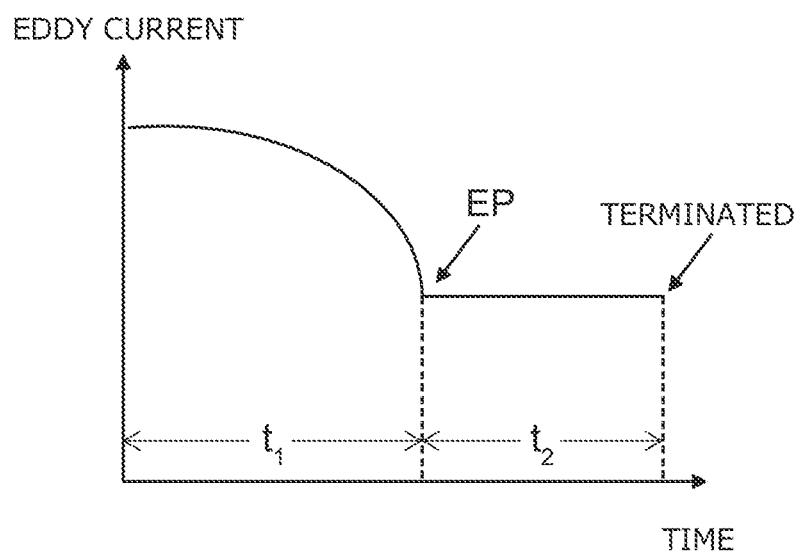
FIG. 6 is a graph illustrating a monitored change of polishing amount.

The first polishing process and the second polishing process in the primary polishing are consecutively performed. Further, the terminating point of the first polishing process is detected for example by monitoring the eddy current flowing in the metal layer 47. For example, FIG. 6 is a graph illustrating a chronological change of an output of a monitored eddy current in the primary polishing.

The first polishing process is performed during a period from the start of the polishing until when $t_1$ elapses, and thereafter the second polishing process is performed. That is, the metal layer 47 is polished, and as a thickness thereof decreases, the eddy current decreases. Just before when the metal layer 47 on the upper surface of the insulating layer 43 is almost removed, the eddy current suddenly drops. Thereafter, substantially a constant value is exhibited. For example, by monitoring a time derivative of the eddy current, any point between the minimum value and zero of the time derivative can be detected as the terminating point EP of the first polishing process.

That is, the time $t_1$ of the first polishing process changes depending for example on the thickness of the metal layer 47, and the state of polishing. On the other hand, the time $t_2$ of the second polishing process is a fixed period of time that is predeterminedly set.

As an alternative to monitoring the eddy current, the polished amount of the metal layer 47 may be detected by monitoring for example a change in torque that causes the polishing stage 3 to rotate. That is, while the metal layer 47 that is softer than the BM layer 45 is being polished, rotational torque of the polishing stage 3 is large; and the rotational torque becomes smaller when the polishing proceeds to the BM layer 45. The terminating point of the first polishing process can be detected by detecting the above-mentioned change.

Further, the controller 60 is for example a sequencer storing the above polishing process and a method of detecting the terminating point thereof, or may be a microprocessor storing a program for executing the above polishing process. The controller 60 may for example be installed in the polishing apparatus 10, or may control the polishing apparatus 10 from outside.

Next, examples will be described with reference to Table 1. In the examples, a microporous pad (IC1000) manufactured by Nitta Haas Incorporated was used as the polishing pad. The metal layer 47 included copper (Cu), and silica slurry (liquid mixture of CMS7501 and CMS7552) manufactured by JSR Corporation was used as the first slurry. Further, 120 hPa (first load) and 240 hPa (second load) were used as the loads upon the polishing.

Liquid mixture of hydrogen peroxide that is an oxidizing agent and silica slurry (liquid mixture of CMS8401 and CMS8452) manufactured by JSR Corporation was used as the second slurry used in the touch-up polishing, and 30 nm of the BM layer 45 and the insulating layer 32 was removed.

Note that, as Comparative Example 1, an example with the second load being identical to the first load will be presented, and as Comparative Example 2, an example that does not spray air will be presented. Further, as Comparative Example 3, an example with an increased amount of sprayed air will be presented.

TABLE 1

|      | Over Load Application (hPa) | Over Cooling (L/min) | Corrosions | Remains of Cu |
|------|-----------------------------|----------------------|------------|---------------|
| CE 1 | 120                         | 0                    | 15         | 6.673         |
| CE 2 | 240                         | 0                    | 166        | 2.79          |
| CE 3 | 240                         | 800                  | 7          | 3.884         |
| EM 1 | 240                         | 200                  | 14         | 2.929         |
| EM 2 | 240                         | 500                  | 10         | 3.04          |

TABLE 2

|      | Flatness (nm) | | | |
|------|---------|--------|---------|---------|
|      | 0.16 μm | 2.0 μm | 10.0 μm | 70.0 μm |
| CE 1 | 17.70   | 14.63  | 15.03   | 15.09   |
| CE 2 | 9.21    | 15.29  | 11.61   | 28.42   |
| CE 3 | 12.59   | 13.83  | 13.27   | 15.45   |
| EM 1 | 11.35   | 11.63  | 13.01   | 27.62   |
| EM 2 | 12.84   | 13.00  | 12.91   | 26.27   |

Table 1 and 2 show polishing characteristics of Examples 1 and 2 of the embodiment (EM), and Comparative Examples (CE) 1 to 3. Over pressure application and over cooling in Table 1 respectively show a polishing load and a sprayed amount of gas in the second polishing process. Further, a number of corrosions per wafer (counted number/wf), remains of the Cu film, and flatness are shown as the polishing characteristics.

The remains of the Cu film are shown by a standard deviation of a chroma distribution that is quantified based on an optical microscopic image after the primary polishing. The corrosions and the flatness were evaluated after the touch-up polishing. The corrosion was measured by using a defect review SEM (KLA2815: manufactured by KLA-Tencor Corporation). Further, the flatness was measured by using an atomic force microscope (AFM). The flatness is a step between both ends of a wiring pattern and a center thereof, and is indicated for each width of the wiring pattern. Foundation followability is exhibited to be higher with larger flatness.

For example, a quality is determined by assuming that a criterion of the corrosions is 20 or less, a criterion of the remains of the Cu film is the standard deviation of 4 or less of the chroma distribution that is quantified based on the optical microscopic image, and a criterion of the flatness is 25 μm or more of the step in the pattern of a wiring width 70.

For example, in Comparative Example 1, although the number of corrosions is less than the criterion and thus is satisfactory, the remains of the Cu film and the flatness do not satisfy their criteria. That is, a remaining amount of the Cu film is large and clarity of the metal residue is thus low. Further, the flatness is small and the foundation followability is thus small. Here, clarity refers to a degree of removal of the residue on a polishing surface, and higher clarity means less residue on a surface of a wiring layer.

In Comparative Example 2, the remains of the Cu film and the flatness satisfy their criterion, thus the clarity of the metal residue and the foundation followability are satisfactory. However, the corrosions are prominent and a deviation thereof from the criterion is large.

In Comparative Example 3, the number of the corrosions satisfies the criterion. However, since the amount of sprayed air is set large, a chemical reaction at the surface of the metal layer is suppressed; and then the remains of the Cu film are deviated from the criterion. There may be an influence of decreasing the foundation followability on the clarity of the metal residue, wherein elastic deformation of the polishing pad 7 is suppressed by excessive cooling.

In Example 1 and Example 2, the number of the corrosions is suppressed, and the remains of the Cu film are also within the criterion. Further, the flatness also excels its criterion value, and an improvement can be recognized in the foundation followability.

That is, according to the polishing method of the embodiment, the clarity of the metal residue and the improvement in the foundation followability of the polished amount can be achieved while suppressing the generation of the corrosions. As a result, the short-circuiting between wirings can be suppressed by reducing the metal layer remaining on the surface of the wiring pattern. Hence, surface defects such as the corrosions and the metal residue are reduced, and a manufacture yield can be improved.

When the clarity of the metal residue is low, both the metal residue and the BM layer are to be polished, and then the touch-up polishing time becomes long, which brings reduction in productivity. In regards to this, the clarity of the metal residue is improved in the embodiment by making the polishing load in the second polishing process larger than the first polishing process. As a result, the time for the touch-up polishing is shortened, and the productivity can be improved.

On the other hand, if the cooling of the polishing pad 7 is excessively performed, a modulus of elasticity thereof becomes large, and the clarity of the metal residue and the foundation followability are thereby failed. From this point of view, the amount of sprayed gas has an upper limit, which in the embodiment is desirably 500 L/min or less. When this value is standardized for example by an area of the polishing pad 7, it is 125 L/min or less, and the amount of sprayed gas is desirably at this upper limit or less.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, the method comprising:

forming a wiring groove in an insulating film that has a recess shallower than the wiring groove;

forming a barrier metal layer and a metal layer, the barrier metal layer covering an upper surface of the insulating film and an inner surface of the wiring groove, and the metal layer filling an inside of the wiring groove and covering the barrier metal layer, wherein the recess is covered by the barrier metal layer and embedded by the metal layer;

polishing the metal layer by applying a first load on the metal layer; and subsequently polishing the metal layer while applying a second load larger than the first load on the metal layer and spraying a gas onto a polishing pad that is in contact with the metal layer, wherein a part of the metal layer embedded in the recess is removed under the second load.

2. The method according to claim 1, wherein the metal layer is polished while monitoring a polished amount based on eddy current that flows in the metal layer.

3. The method according to claim 1, wherein the metal layer is polished while monitoring a polished amount based on rotational torque of a polishing stage onto which the polishing pad is attached.

4. The method according to claim 1, wherein the first polishing process consecutively transitions to the second polishing process, when a terminating point of the first polishing process is detected.

5. The method according to claim 1, wherein a terminating point of the second polishing process is determined by elapsed time from a starting time point of the second polishing process.

6. The method according to claim 1, wherein the metal layer includes copper (Cu).

7. The method according to claim 1, wherein the metal layer is polished using a CMP method.

8. The method according to claim 1, wherein the gas is compressed air or nitrogen.

9. The method according to claim 1, wherein a flow rate of the gas sprayed onto the polishing pad is 500 liters or less per minute.

10. The method according to claim 1, the method further comprising:
    polishing the barrier metal layer using a CMP method.

11. The method according to claim 1, wherein the barrier metal layer includes titanium and tantalum.

12. The method according to claim 1, wherein the gas is sprayed from a gas nozzle including a bar-shaped nozzle that extends in a direction from a center of the polishing pad toward an outer circumference thereof, and a plurality of gas outlets aligning on a face opposite to the polishing pad.

* * * * *